(12) United States Patent
McKee et al.

(10) Patent No.: US 6,306,668 B1
(45) Date of Patent: Oct. 23, 2001

(54) CONTROL METHOD AND SYSTEM FOR USE WHEN GROWING THIN-FILMS ON SEMICONDUCTOR-BASED MATERIALS

(75) Inventors: Rodney A. McKee, Kingston; Frederick J. Walker, Oak Ridge, both of TN (US)

(73) Assignee: UT-Battelle, LLC, Oak Ridge, TN (US)

(*) Notice: Subject to any disclaimer, the term of this patent is extended or adjusted under 35 U.S.C. 154(b) by 0 days.

(21) Appl. No.: 09/404,512

(22) Filed: Sep. 23, 1999

(51) Int. Cl.[7] .................................................. H01L 21/20
(52) U.S. Cl. .............................. 438/7; 438/478; 438/14; 117/85
(58) Field of Search ..................................... 505/483, 478, 505/481; 428/700, 701, 702, 973; 427/248.1; 117/108, 109, 200, 201, 84, 85; 438/5, 7, 14

(56) References Cited

U.S. PATENT DOCUMENTS

| | | | |
|---|---|---|---|
| 4,710,259 | * 12/1987 | Howe et al. | 156/601 |
| 4,855,013 | * 8/1989 | Ohta et al. | 156/601 |
| 4,962,057 | * 10/1990 | Epler et al. | . |
| 5,120,393 | * 6/1992 | Kubo et al. | 156/611 |
| 5,148,025 | * 9/1992 | Ahn et al. | 250/305 |
| 5,225,031 | 7/1993 | McKee et al. | 425/255 |
| 5,450,812 | 9/1995 | McKee et al. | 117/84 |
| 5,554,415 | * 9/1996 | Turchan et al. | 427/248.1 |
| 5,588,995 | * 12/1996 | Shedon | 117/201 |
| 5,588,999 | * 12/1996 | Takahashi | 118/715 |
| 5,691,280 | * 11/1997 | Eckstein et al. | 505/329 |
| 5,827,802 | * 10/1998 | Lagues | 505/473 |
| 5,919,515 | * 6/1999 | Yano et al. | 427/126.3 |
| 6,121,647 | * 9/2000 | Yano et al. | 257/295 |

* cited by examiner

Primary Examiner—Savitri Mulpuri
(74) Attorney, Agent, or Firm—Michael E. McKee

(57) ABSTRACT

A process and system for use during the growth of a thin film upon the surface of a substrate by exposing the substrate surface to vaporized material in a high vacuum (HV) facility involves the directing of an electron beam generally toward the surface of the substrate as the substrate is exposed to vaporized material so that electrons are diffracted from the substrate surface by the beam and the monitoring of the pattern of electrons diffracted from the substrate surface as vaporized material settles upon the substrate surface. When the monitored pattern achieves a condition indicative of the desired condition of the thin film being grown upon the substrate, the exposure of the substrate to the vaporized materials is shut off or otherwise adjusted. To facilitate the adjustment of the crystallographic orientation of the film relative to the electron beam, the system includes a mechanism for altering the orientation of the surface of the substrate relative to the electron beam.

17 Claims, 4 Drawing Sheets

AEO rich, <110> DIRECTION

TiO₂ rich <210> DIRECTION

TiO₂-rich, <100> DIRECTION

CONTROL METHOD AND SYSTEM FOR USE WHEN GROWING THIN-FILMS ON SEMICONDUCTOR-BASED MATERIALS

This invention was made with Government support under Contract No. DE-AC05-96OR22464 awarded by the U.S. Department of Energy to Lockheed Martin Energy Research Corporation, and the Government has certain rights in the invention.

BACKGROUND OF THE INVENTION

This invention relates generally to the growth of thin-films upon semiconductor-based materials and relates, more particularly, to the means and methods by which the growth of such thin-films in a high vacuum facility can be controlled.

The growth of thin-films in a high vacuum facility may be monitored with Reflection High Energy Electron Diffraction (RHEED) techniques involving the use of a high energy electron beam emitted from an electron gun to diffract electrons off of a substrate (i.e. target) surface at a glancing angle. These diffracted electrons are diffracted in a pattern which provides crystallographic information of the film surface. More specifically, each crystallographic condition of the film surface evidences a signature electron diffraction pattern so that during a thin-film growth process, a desired crystallographic condition of the film surface can be substantiated by an electron diffraction pattern which is indicative of the desired crystallographic condition.

However, to obtain desired RHEED measurements by conventional techniques, the substrate upon which the thin film is grown is rigidly mounted within the high vacuum facility and must typically, on occasion, be physically adjusted in position relative to the electron gun. Of course, in order to make adjustments in the position of the substrate, the film growth process must be halted and the facility may even have to be opened to gain access to the substrate. It follows that this conventional technique is time-consuming and is not well-suited for mass production techniques.

An object of the present invention is to provide a new and improved process and system for use during the growth of thin-films upon a substrate surface in a HV facility enabling the film growth process to be efficiently controlled.

Another object of the present invention is to provide such a process which is well-suited for mass production techniques.

Still another object of the present invention is to provide such a process which is uncomplicated to perform yet effective in operation.

SUMMARY OF THE INVENTION

This invention resides in a process for growing a thin film upon the surface of a substrate involving the exposure of the substrate surface to vaporized material in a high vacuum (HV) facility and an associated system.

Within the process of the invention, the improvement comprises the steps of directing an electron beam generally toward the surface of the substrate as the substrate is exposed to vaporized material so that electrons are diffracted from the substrate surface by the beam and monitoring the pattern of electrons diffracted from the substrate surface as vaporized material settles upon the substrate surface. The improvement further includes the step of shutting off or otherwise adjusting the exposure of the substrate to the vaporized materials when the monitored pattern achieves a condition indicative of the desired condition of the thin film being grown upon the substrate.

A system of the invention includes means mounted within the HV facility for directing an electron beam generally toward the surface of the substrate so that electrons are diffracted from the substrate surface and means mounted within the HV facility for monitoring the pattern of electrons diffracted from the substrate surface. The system also includes means connected between the substrate and the directing means for moving the substrate and the directing means relative to one another to facilitate an adjustment of the crystallographic orientation of the thin film being grown upon the substrate surface relative to the directed electron beam.

DETAILED DESCRIPTION OF THE ILLUSTRATED EMBODIMENTS

Figure 1:
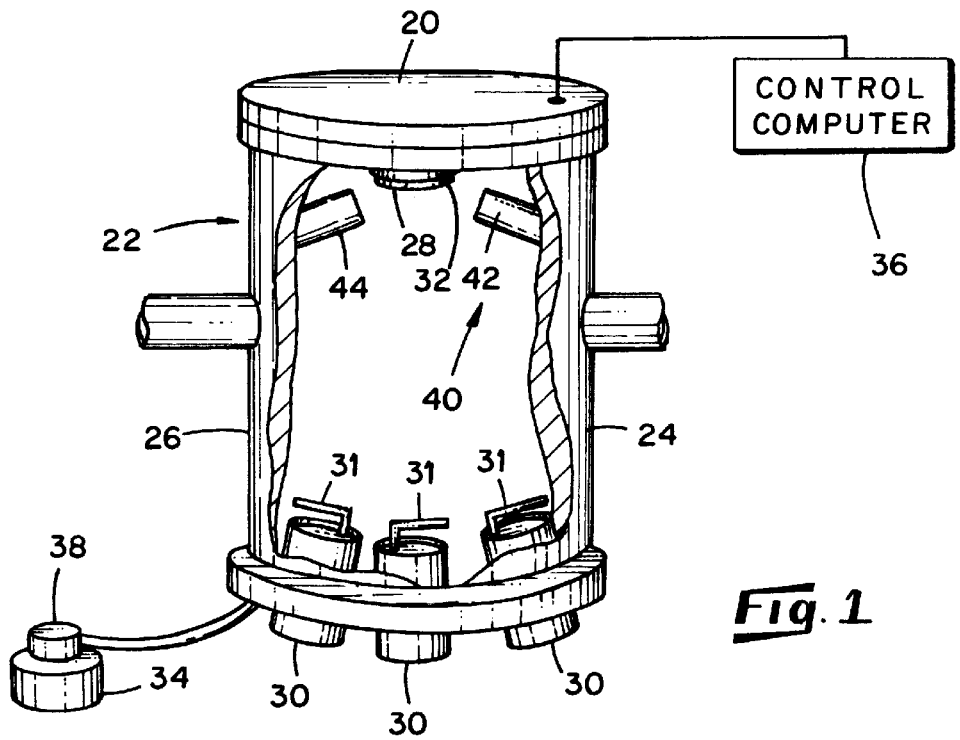
FIG. 1 is a schematic perspective view of a fragment of an ultra high vacuum (UHV) facility, shown partially cut-away, within which an embodiment of a growth-control system of the present invent employed.

Turning now to the drawings in greater detail, there is illustrated in FIG. 1 a schematic representation of thin-film growth equipment 20 within which an embodiment of a growth-control system, generally indicated 22, is incorporated. The equipment 20 includes an ultra-high vacuum (UHV) facility 24 having a container 26 defining an inner chamber within which a substrate 28 is positionable and a plurality of canisters 30 mounted within the base of the container 26 for providing a vapor source of metals desired to be added to the substrate 28 in the form of a deposited film. As will be described in greater detail herein, the system 22 facilitates the monitoring of the condition of the crystalline lattice of the film being grown upon the surface of the substrate 28 so that better control over the growth of the film can be had.

Figure 2:
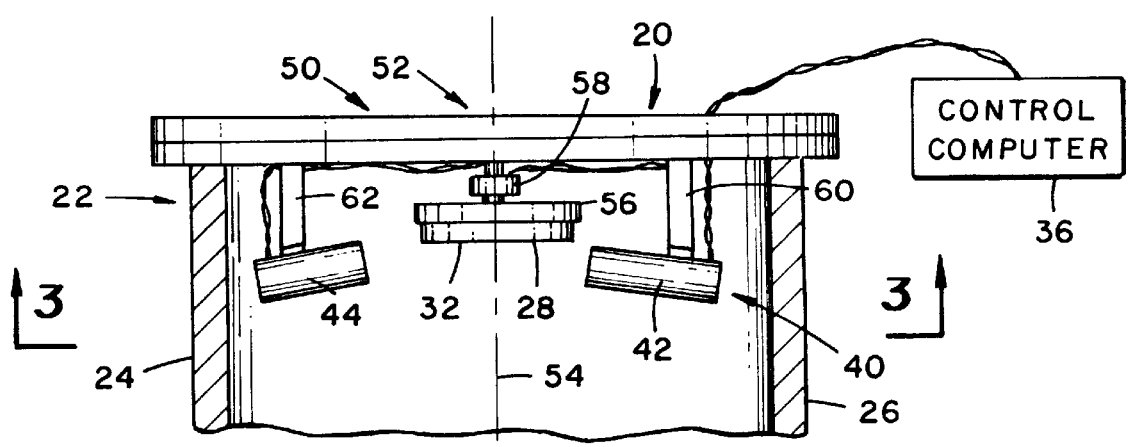
FIG. 2 is a longitudinal cross sectional view of a portion of the UHV facility of FIG. 1.
Figure 3:
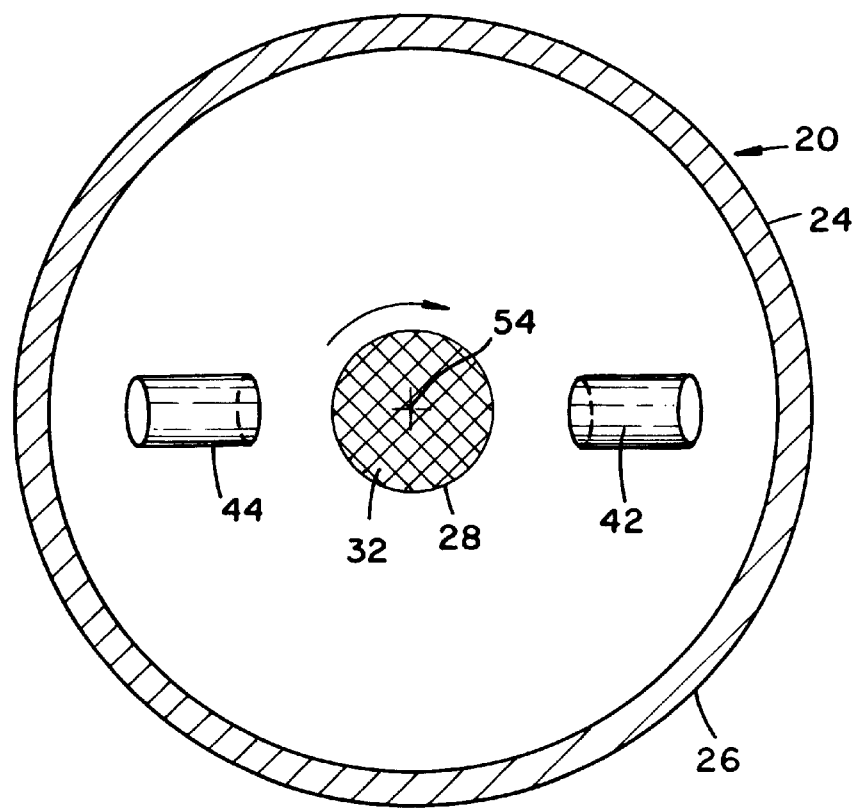
FIG. 3 is a cross-sectional view taken about along line 3—3 of FIG. 2.

As will be appreciated by those skilled in the art, when preparing the UHV facility 24 to grow a film of desired composition upon a substrate 28, the substrate 28 is mounted within the chamber of the facility container 26 so that its surface, indicated 32 in FIG. 2, faces generally downwardly, and each element desired to be deposited upon the substrate surface 32 is placed within a corresponding canister 30. In this connection, each canister 30 is adapted to hold a crucible containing a desired element and contains heating elements for vaporizing the metal. An opening is provided in the top of each canister 30, and a shutter 31 is associated with the canister opening for movement between a closed condition at which the contents of the canister 30 therein is isolated from the substrate surface 32 and an opened condition at which the contents of the canister 30, i.e. the vaporized element, is exposed to the substrate surface. In addition, an oxygen source 34 is connected to the chamber of the facility 24 so that by opening and closing a valve 38 associated with the source 34, oxygen can be delivered to or shut off from the chamber. The opening and closing of each canister shutter 31 and the oxygen source valve 38 is accurately controlled by a computer controller 36.

For purposes of monitoring the condition of the film being grown upon the substrate surface 32, the system 22 includes an electron gun/detector assembly 40 mounted alongside the substrate 28 adjacent the top of the facility container 26. More specifically, the electron gun/detector assembly 40 includes an electron gun 42 and a detector 44 mounted at diametrically-opposed locations across the substrate surface 32 and is used to monitor the condition of the film being grown by known Reflection High Energy Electron Diffraction (RHEED) techniques. Briefly, the electron gun 42 directs a high energy electron beam generally toward (albeit at an angle) to diffract electrons off of the substrate surface at a glancing angle. The diffraction pattern of the electrons is detected by the detector 44, such as a fluorescent screen, and this diffraction pattern provides crystallographic information relating to the condition of the film surface.

The information desired by the RHEED techniques described herein relates to the lateral arrangement of the atoms in the topmost layer(s) of the film being built. Although a detailed description will not be provided herein as to how to interpret RHEED patterns, suffice it to say that the RHEED pattern is essentially the reciprocal lattice of the surface.

It is also fundamental to the monitoring process performed with the electron gun/detector assembly 40 that the desired arrangement of atoms at (or near) the surface of the substrate will provide a specific signature in its RHEED pattern. Along the same lines, it will also be appreciated that as the atoms of vaporized material settle upon (and thereby build up upon) the surface of the substrate 28, changes are experienced in the crystallographic characteristics of the substrate surface 32. Accordingly, the RHEED patterns acquired from the substrate surface 32 at one stage of a vapor-deposition process are different from the RHEED patterns acquired from the substrate surface 32 at a subsequent stage of a film-growth process. It also follows, therefore, that when the RHEED pattern matches the signature characteristic corresponding to the desired condition of the substrate surface 32, then the thin film will have attained its desired quality or condition.

To obtain accurate characterizations of the substrate surface 32 during a film-growth process, it occasionally becomes necessary to alter the orientation of the substrate 28 relative to the gun/detector assembly 40 (and consequently the electron beam directed from the gun 42 thereof) so that the gun-directed beam is directed along a desired path (e.g. an [001] direction) across the crystalline lattice of the substrate surface 32. Heretofore, adjustments between the relative position of the substrate surface 32 and the gun/detector assembly 40 required that the film-growth process be halted (by, for example, shutting off the exposure of the substrate surface 28 to the vaporized material) and the growth facility 24 opened to gain access to the substrate 28 for adjustment of its position. Of course, after the positional adjustment is made to the substrate 28, the facility 24 is closed, and the high vacuum conditions must be re-established before the growth process can be re-initiated. It follows that prior art efforts required to make a positional adjustment of the substrate relative to the gun/detector assembly were laborious and time-consuming.

It is a feature of the system 22 that it includes means, generally indicated 50, for expeditiously altering the relative position between the substrate surface 32 and the gun/detector assembly 40 during the course of a thin film deposition process to thereby facilitate an adjustment in the orientation of the gun-emitted beam relative to the substrate surface 32. The depicted altering system 50 includes means 52 for rotating the substrate 28 about its vertical centerline, indicated 54 in FIG. 2, to thereby alter the angular relationship of the gun-emitted beam relative to the crystalline lattice structure of the substrate surface 32. The capacity to adjust the angular relationship of the gun-emitted beam in this manner permits the gun-emitted beam to be accurately aligned along a predetermined direction (e.g. an [001] direction) across the crystalline lattice of the substrate surface 32 in order to obtain the desired characteristics of the lattice of the film being grown upon the surface of the substrate 28.

In the depicted example, the altering means 50 includes a rotatable turntable 56 mounted for rotation about the vertical axis 54, which axis corresponds with the vertical centerline of the substrate surface 28, and the electron gun 42 and detector 44 are supported from the upper surface of the facility 24 so as to be disposed at diametrically-opposed locations across the turntable 56. The turntable 56 is plate-like in form and is supported at the end of a shaft of a servomotor 58 which is, in turn, supported from the upper surface of the facility 24. When it is desired to alter the positional relationship of the substrate surface 32 relative to the gun/detector assembly 40, appropriate command signals are sent to the motor 58 from the computer controller 36 to rotate the turntable 56 by a desired amount. RHEED measurements can then be obtained from the substrate surface 32 at that altered positional relationship.

Each of the electron gun 42 and detector 44 of the gun/detector assembly 40 is supported from the chamber of the facility 24 in a manner which is well-known in the art. Briefly, each of the gun 42 and detector 44 is supported in a fixed position at the lower end of a corresponding bracket 60 or 62 which is attached at its upper end to the top of the facility chamber. As do other conventional electron guns, the depicted gun 42 includes internal mechanisms which permit the direction of the emitted electron beam to be altered along a vertical plane to thereby alter the angle of incidence between the gun-emitted beam and the substrate surface 32. It follows that by rotating the substrate 28 about its centerline 54 and adjusting, as necessary, the direction of the emitted beam along a vertical plane, RHEED measurements can be taken from any direction across any location on the surface 32.

It will also be understood from the foregoing that in order to obtain a desired RHEED measurement of the substrate surface 32 (and thereby accurately monitor the condition of the crystalline lattice of the surface 32), it may be required that the angular relationship between the gun/detector assembly 40 and the substrate surface 32 about the vertical axis 54 and/or the angle of incidence between the gun-emitted beam and the substrate surface 32 be altered. If such is the case, the servomotor 58 is appropriately energized to reposition the substrate 28 about the axis 54 to reorient the crystallographic orientation of the substrate 28 relative to the gun/detector assembly 40 or the internal mechanisms of the gun 42 are actuated to adjust the angle of incidence of the gun-emitted beam relative to the substrate surface 32.

As mentioned above, the servomotor 58 (as well as the internal adjustment mechanisms of the gun 42) are connected to the control computer 36 for accurately controlling the positional relationship of the gun/detector assembly 40 relative to the crystalline lattice of the substrate surface 32. In other words, the control computer 36 is responsible for sending command signals to the motor 58 and gun 42 which, in turn, are responsible for positioning the lattice structure of the surface 32 in a desired orientation relative to the gun-emitted beam and for directing the gun-emitting beam toward the substrate surface 32 at a desired angle of incidence.

Figure 4:
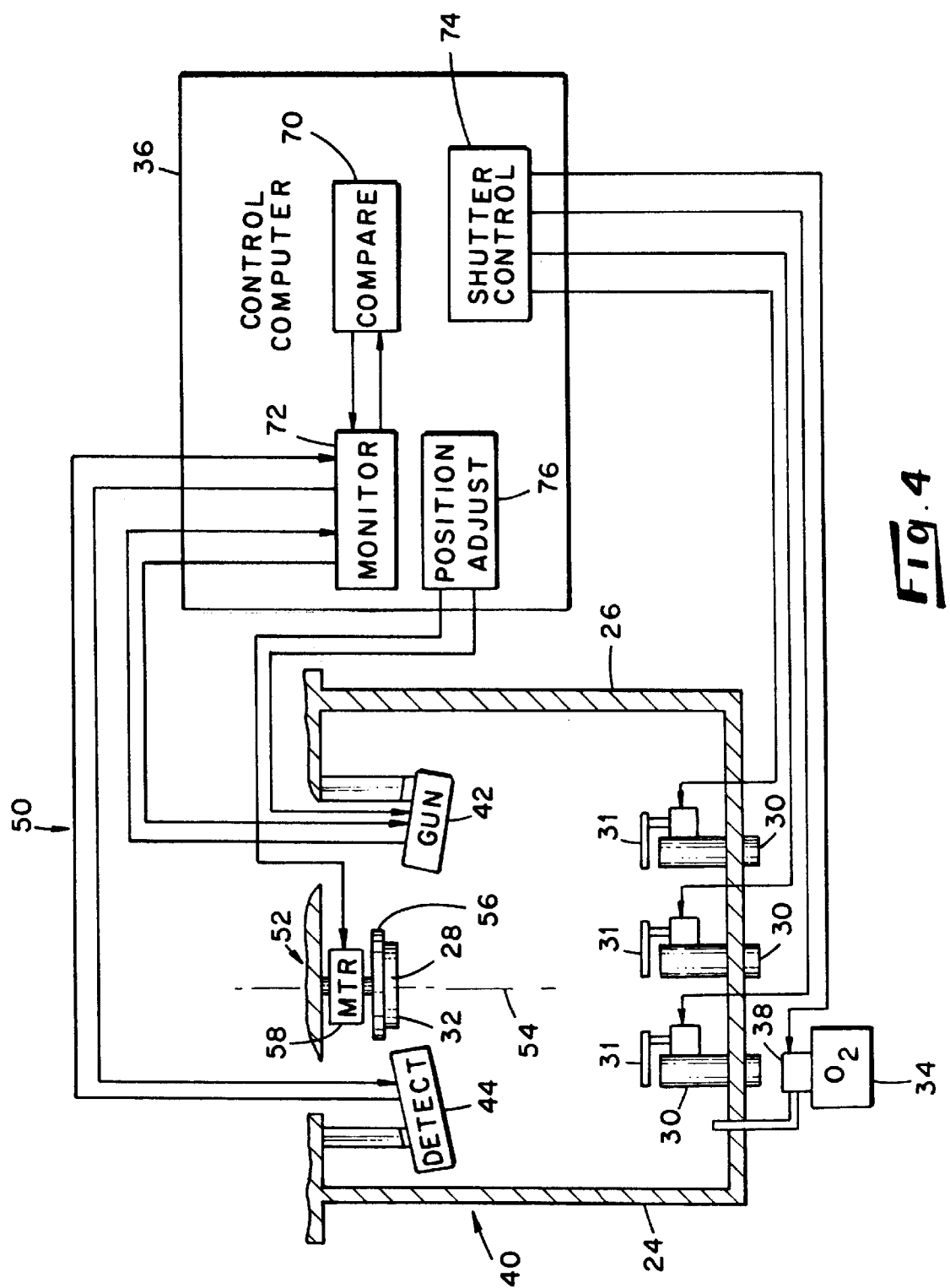
FIG. 4 is a view illustrating in block diagram form the operation of the embodiment of the system utilized in the FIG. 1 system.

The operation of the system 22 can be summarized with reference to the block diagram shown in FIG. 4. During a deposition process, one or more shutters 31 (FIG. 1) and/or the valve 38 from the oxygen source 34 are opened to expose the substrate surface 32 to vaporized materials emitted from the canisters 30 and/or to oxygen from the source 34. Meanwhile, the electron gun 42 and detector 44 are used to diffract electrons from the substrate surface 28 in a RHEED-monitoring operation as the deposition-process is underway. The position of the electron gun and detector relative to the substrate surface may have to be altered, as necessary, in order to obtain the desired measurements (i.e. the desired crystallographic orientation of the electron beam relative to the surface 32). To adjust the positional relationship of the gun-emitted beam relative to the substrate surface 32 (and thereby adjust the either or both of the angular relationship of the gun/detector assembly 40 about the vertical axis 54 and the angle of incidence between the gun-emitted beam and the substrate surface 32), the control computer 36 sends appropriate command signals to the servomotor 56 and the internal adjustment mechanisms of the gun 42.

Within the database of the control computer 36, there is included programmed information as to how the diffraction pattern of the electrons should appear when the crystallographic information of the substrate surface has attained its desired characteristics. During a film-deposition process, monitoring circuits 72 (FIG. 4) within the computer 36 gather the RHEED information being collected by the gun/deflector assembly 40 and comparison circuits 70 continually compare the gathered RHEED information to the stored information. When the RHEED data being collected matches the crystallographic information stored in the computer 36 as a target pattern, which information, or pattern, is indicative of a desired condition of the thin film being grown upon the substrate 32, appropriate command signals (initiated at a shutter control circuit 74 are sent to the canisters 30 for closing the shutters 31. When it becomes necessary to adjust the positional relationship of the lattice structure of the substrate surface 32 relative to the gun-emitted beam, appropriate command signals (originating from an adjustment circuit 76) are sent to the servomotor 58 or the gun 42. As will be apparent in the following examples, the shutters 31 can be shut off upon completion of a single film layer of a desired material or can be shut off upon completion of a fraction of a monolayer of a desired material. Of course, upon completion of a build-up of a single film layer of a desired material, the build-up of an additional layer of a second desired material can be initiated by opening (by way of appropriate command signals from the computer 36) the shutters 31 to the canisters 30 within which the materials (or the constituents thereof) are emitted.

EXAMPLE #1

In a first example (which is applicable to the build up of an alkaline earth oxide upon a semiconductor-based substrate comprised of silicon, germanium or a silicon-germanium alloy), the system 22 will be described herein in conjunction with the build up of an epitaxial layer of the alkaline earth oxide BaO upon a silicon substrate. The principles of the growth process are described in detail in U.S. Pat. No. 5,225,031, but for present purposes are summarized here as follows.

A silicon substrate 28 having a surface 32 which is atomically clean is mounted within the HV facility 24 so that its surface faces generally downwardly, and then the temperature of the substrate is raised to an elevated temperature of between about 850° and 1050° C. as high vacuum conditions are developed within the facility 24. The shutter 31 covering one flux source (i.e. one canister 30) of the metal Ba is opened so that the metal Ba is deposited upon the substrate surface until a fraction of a monolayer (i.e. one-fourth of a monolayer) of the metal covers the silicon substrate 32. At that point, the deposition process is halted, and the temperature of the substrate is lowered to between about 200° and 300° C.

Once the lower substrate temperature is reached, an additional amount of the metal Ba is deposited upon the substrate from the flux source until the substrate 32 is covered by about one monolayer of the metal. The pressure of the HV facility 24 is then raised to a target pressure (between about $1\times10^{-6}$ torr and $5\times10^{-6}$ torr), and then the substrate surface 32 is exposed to oxygen and an additional amount of the metal Ba from the flux source so that the epitaxial oxide BaO begins to grow upon the substrate surface 32.

Hence, it follows that during a first growth stage of this example involving an initial deposition of Ba upon the silicon substrate, it is important that the deposition process be halted when a fraction (i.e. one-fourth) of a monolayer of the Ba layer is reached. Similarly, it follows that during a second stage of this growth process involving the subsequent deposition of Ba upon the silicon substrate, it is important that the deposition process be halted when the thickness of the thin film of Ba reaches about one monolayer in thickness.

Turning attention to the function of the system 22 during the building of the aforedescribed layer of BaO upon a silicon surface, a silicon substrate having an atomically-clean surface is mounted face-downwardly upon the turntable 56. The temperature of the substrate is then raised to the aforedescribed elevated temperature, and high vacuum conditions are developed within the facility. The metal Ba from a flux source of the metal (contained within one of the canisters 30) is then begun to be deposited upon the substrate surface while the conditions of the deposited film are monitored with the electron gun/detector assembly 40. In other words, as the flux of Ba begins to settle upon the silicon surface, the lateral spacing of the Ba atoms are monitored with the electron gun/detector assembly 40 and the Ba deposition (of this first phase of the growth process) is halted when the pattern of diffracted electrons, as detected by the detector 44, obtains a condition indicative of one-fourth of a monolayer of Ba. To this end, the computer 36 contains information relating to the signature RHEED pattern indicative of the growth of one-fourth of a monolayer of Ba.

Figure 5:
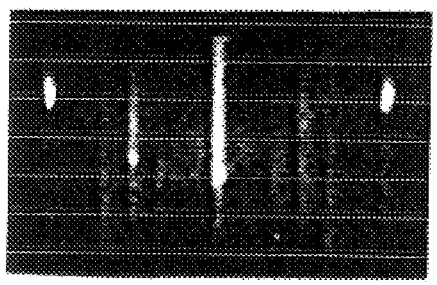
FIGS. 5 and 6 are photographs providing Reflection High Energy Electron Diffraction (RHEED) data collected at various stages of $BaSi_2$ formation on the (001) surface of silicon.
Figure 6:
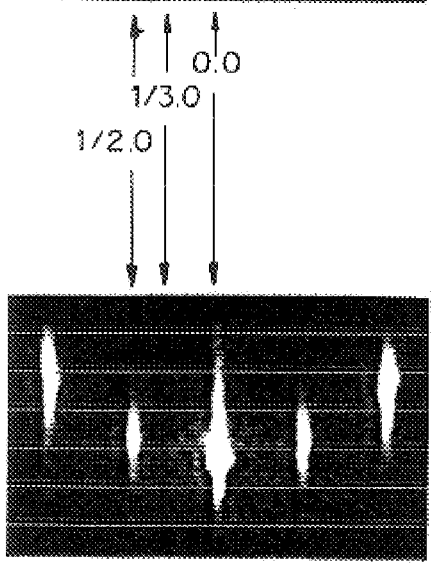

For comparison purposes, there is shown in FIG. 5 the RHEED pattern of the diffracted electrons when one-sixth of a monolayer of Ba is deposited over the silicon substrate, and there is shown in FIG. 6 the RHEED pattern of the diffracted electrons when one-fourth of a monolayer of Ba is deposited over the silicon substrate. It can be seen that the energy of the electrons (corresponding generally to the brightness of the dots in the pattern) is greater in the FIG. 6 pattern at the 1/2,0 location than it is in the FIG. 5 pattern whereas the energy of the diffracted electrons is less in the FIG. 6 pattern at the 1/3,0 location than it is in the FIG. 5 pattern.

It therefore follows that when the pattern of diffracted electrons obtained across the substrate surface being monitored attains the pattern depicted in FIG. 6, the Ba deposition is halted (by closing the appropriate canister shutter 31) and the temperature of the substrate is lowered and the internal pressure of the facility is adjusted as aforedescribed. When Ba deposition is subsequently resumed (to initiate the second stage of the Ba deposition), the film surface is again monitored with the electron gun/detector assembly 40 to determine when the thickness of the Ba layer reaches one monolayer. Again, the pattern of the diffracted electrons gathered by the gun/detector assembly 40 bears a RHEED pattern indicative of the signature RHEED pattern of a single monolayer thickness of Ba, the deposition process is halted by closing the appropriate canister shutter 31.

EXAMPLE #2

In a second example [which is applicable to the growth of a thin film designated generally as A'BO$_3$(as described in our U.S. Pat. No. 5,830,270) upon an AO or BO$_2$ truncated perovskite surface wherein each unit cell of the A'BO$_3$ structure is comprised of a single plane of alkaline earth oxide (AeO) and a single plane of a transition metal oxide (TmO)], the system 22 will be described herein for use in conjunction with the build up of a perovskite oxide structure, such as BaTiO$_3$, upon an alkaline earth oxide, exemplified by an MgO, surface. The principles of such a growth process is described in detail in U.S. Pat. No. 5,693,140 so that a detailed description of the build-up process is not believed to be necessary. It is relevant in the build-up process, however, that the perovskite structural unit for BaTiO$_3$ is comprised of separately-identifiable planes wherein one plane is comprised of BaO and the other plane is comprised of TiO$_2$. The build-up process is effected by depositing an initial plane of TiO$_2$ upon the MgO surface, and thereafter depositing alternating planes of BaO and TiO$_2$ upon the initial plane.

The two planes (i.e. the BaO and Tio$_2$ planes) of the perovskite BaTiO$_3$ contain different atoms with different atomic scattering factors and are sensitive to observation by electron scattering from a film surface that might be truncated with either a BaO plane or a TiO$_2$ plane. Generally, within a perovskite structure, the BaO plane is considered as the alkaline earth oxide (AeO) plane and the TiO$_2$ plane is the transition metal oxide (TmO) plane of the perovskite structure.

The system 22 of the present invention is used to monitor the surface upon which the vaporized materials are being deposited to determine when overcoverage (or atomic concentration) of the corresponding planes of AeO or TmO occurs. In other words, since a growing film which is truncated with either an AeO plane or a TmO plane can be characterized with RHEED to determine its composition, RHEED data collected during the monitoring of the deposition surface can be used to determine when a grown plane of AeO or TmO has ben completed.

Figure 8:
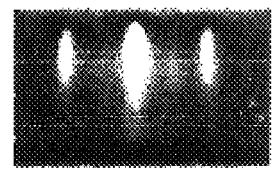
FIGS. 7–9 are photographs providing RHEED data collected at various stages of a build up of a perovskite onto a substrate surface.
Figure 9:
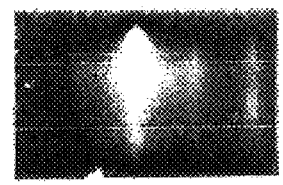
Figure 7:
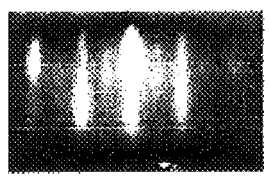

For example, there is shown in FIGS. 7–9 show RHEED images taken from CaTiO$_3$ showing reconstruction rods visible at the [100] and [210] zone axes for a titanium-rich TiO$_2$truncation and at the [110] zone axis for a Ca rich CaO-truncation. Characteristically in these images are brighter prominent diffraction rods (vertical streaks) and dimmer "½ order" diffraction rods in between the principal or brighter diffraction rods. For a surface, either AeO or TmO-truncated, that is stoichiometric, the ½ order rods do not show up. These ½ order rods are the signature of overcoverage that are monitored in real time during thin film growth.

Although the RHEED images of FIGS. 7–9 indicate Ti-rich (FIGS. 7 and 9) and AeO-rich (FIG. 8) deposits indicative of an overcoverage of the perfect stoichiometric conditions of the layer being deposited, adjustments can be made to the deposition process by, for example, shuttering or dynamically changing the arrival rate of the constituent shown to be in excess. In other words, even though the signature pattern of constituent overcoverage appears (as in FIG. 7, 8 or 9), appropriate adjustments can be made in the deposition process so that the ½ order rods disappear and the diffraction condition of the perfectly stoichiometric perovskite is again obtained.

By capturing these RHEED images (e.g. FIGS. 7–9) in real time using a digitization of a video image taken from the phosphor screen that is collecting scattered electrons from the growing thin film surface, computer analysis of line scans across the major and minor rods from these patterns are used as feedback for a composition control process in a UHV growth chamber. This control process can be as simple as hand control of system growth parameters by an operator or more elegantly implemented in an electronic control process. Based upon testing performed to date, a sensitivity of at least 0.07 monolayers can be had. Heretofore, such a sensitivity was not attainable by any other known dynamic growth process monitoring scheme.

It follows from the foregoing that a system has been described which monitors the crystallographic characteristics of the last-grown plane and permits plane-by-plane composition adjustment and/or termination of the growth process based upon the monitored characteristics.

It will be understood that numerous modifications and substitutions can be had with the aforedescribed embodiments without departing from the spirit of the invention. For example, although the aforedescribed process has addressed the use of electron beam diffraction for monitoring the surface characteristics of the film being grown, alternative diffraction techniques, such as x-ray diffraction, which are sufficiently sensitive to atomic surface structure can be used. However, for x-rays, the sensitivity to a crystal surface is complicated by the beam penetration in normal x-ray methods. However, in a synchrotron in which the x-ray beam is extremely intense and can be made to be surface-sensitive, the x-ray methods equally can be used to monitor the surface conditions.

Figure 10:
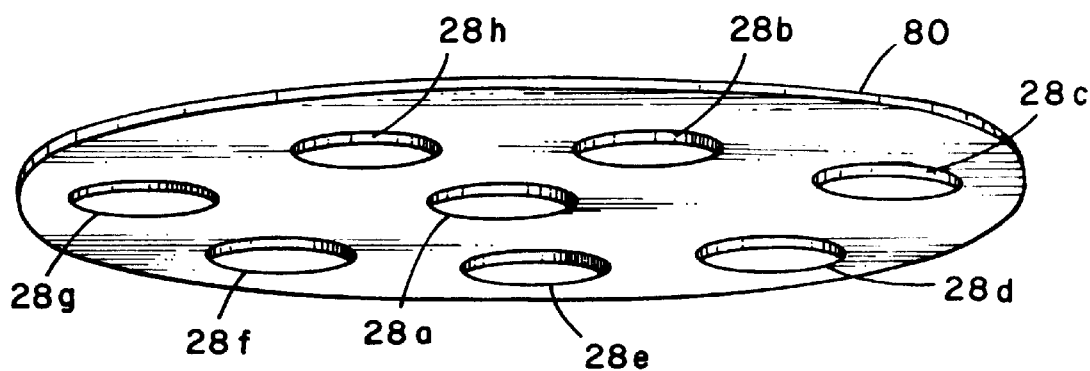
FIG. 10 is a perspective view of a support plate capable of being mounted within the growth facility of FIG. 1 and a plurality of substrates which have been mounted upon the plate.

Further still, although a single substrate 28 has been shown and described as being positioned within the facility 24 of the FIG. 1 system 22 for a thin film deposition operation as the thin film growth upon the substrate 28 is monitored in accordance with the process of the present invention, it will be understood that more than one substrate can be mounted within the facility 24 of the system 22 during a thin film deposition operation so that a thin film is deposited upon each substrate mounted within the facility 24. For example, there is shown in FIG. 10 a plurality of substrates 28a–28h mounted upon a support plate 80 (or turntable) which can be positioned within the interior of the facility 24 for simultaneous deposition of a thin film upon each of the substrates 28a–28h. While the thin film growth process is underway, the thin film growth of a single substrate, such as the substrate 28a, representative of the condition of each substrate, is monitored in accordance with the process of the present invention so that information is gathered as to the condition of the growth of the thin film on each substrate in the facility 24. A thin film growth process involving a plurality of substrates is believed to be advantageous for mass production of thin film-on-substrate structures.

Accordingly, the embodiments described herein are intended for the purpose of illustration and not as limitation.

What is claimed is:

1. In a process for growing or controlling the growth of a thin film upon the surface of a substrate involving the exposure of the substrate surface to vaporized material in a high vacuum (HV) facility, the improvement comprising:
   directing a beam in a computer-controlled process toward the surface of the substrate as the substrate is exposed to vaporized material to effect diffraction from the substrate surface by the beam;
   monitoring the diffraction pattern of the substrate surface as vaporized material settles upon the substrate surface including the steps of providing a programmed and computer-stored target pattern of diffraction wherein the target pattern corresponds to the pattern of diffraction indicative of the desired condition of the film being grown upon the substrate and wherein the monitoring step is sensitive to within 0.07 of a monolayer of the film and continually comparing the monitored pattern to the target pattern as the vaporized material settles upon the substrate surface; and
   automatically shutting off or otherwise adjusting the exposure of the substrate to the vaporized material when the monitored pattern matches the target pattern.

2. The improvement as defined in claim 1 wherein the step of directing is followed by a step altering, as necessary, the orientation of the surface of the substrate relative to the beam to obtain a desired crystallographic orientation of the film being grown relative to the directed beam.

3. The improvement as defined in claim 2 wherein the step of directing is performed by an electron gun which directs an electron beam toward the target, and the step of altering includes a step of moving the substrate and electron gun relative to one another to adjust the crystallographic orientation of the film being grown upon the substrate surface relative to the directed electron beam.

4. The improvement as defined in claim 3 wherein the step of moving includes the step of moving the substrate while the electron gun remains fixed in position.

5. The improvement as defined in claim 4 wherein the step of moving the substrate includes a step of rotating the substrate about an axis to adjust the angular orientation of the surface of the substrate relative to the electron beam.

6. The improvement as defined in claim 2 wherein the step of directing is performed by an x-ray gun which directs an x-ray beam toward the target, and the step of altering includes a step of moving the substrate and x-ray gun relative to one another to adjust the crystallographic orientation of the film being grown upon the substrate surface relative to the directed x-ray beam.

7. The improvement as defined in claim 6 wherein the step of moving includes the step of moving the substrate while the x-ray gun remains fixed in position.

8. The improvement as defined in claim 7 wherein the step of moving the substrate includes a step of rotating the substrate about an axis to adjust the angular orientation of the surface of the substrate relative to the x-ray beam.

9. The improvement as defined in claim 1 wherein the beam which is directed toward the target in the directing step is an electron beam.

10. The improvement as defined in claim 1 wherein the step of shutting off or otherwise adjusting the exposure is effected when the monitored pattern achieves a condition indicative of the desired condition of a first growth phase of the thin film being grown upon the substrate, and the step of shutting off or otherwise adjusting the exposure is followed by the steps of:
    exposing the substrate surface to additional vaporized materials in the HV facility to build upon the thin film grown upon the substrate during the first growth phase;
    directing a beam generally toward the surface of the substrate as the substrate is exposed to the additional vaporized material to effect diffraction from the thin film being built upon the substrate surface;
    monitoring the pattern of diffraction from the thin film as the additional vaporized material settles upon the substrate; and
    shutting off or otherwise adjusting the exposure of the substrate to the additional vaporized materials when the monitored pattern achieves a desired condition indicative of the desired condition of a subsequent phase of the thin film being grown upon the substrate.

11. The improvement as defined in claim 1 wherein the beam being directed toward the target in the directing step is an x-ray beam.

12. A process for controlling the growth of a thin film upon the surface of a substrate involving the exposure of the substrate surface to vaporized material in a high vacuum (HV) facility in multiple growth stages, the process including the steps of:
    (a) exposing the surface of the substrate to vaporized material during one growth stage of the build up of the thin film upon the substrate surface;
    (b) directing an electron beam in a computer-controlled process toward the surface of the substrate as the substrate surface is exposed to the vaporized material so that electrons are diffracted from the substrate surface;
    (c) monitoring the pattern of electrons diffracted from the substrate surface as the vaporized material settles upon the substrate surface including the steps of providing a programmed and computer-stored target pattern of diffraction wherein the target pattern corresponds to the pattern of diffraction indicative of the desired condition of one stage of the thin film being grown upon the substrate and wherein the monitoring step is sensitive to within 0.07 of a monolayer of the film and continually comparing the monitored pattern to the target pattern as the vaporized material settles upon the substrate surface;
    (d) automatically shutting off or otherwise adjusting the exposure of the substrate to the vaporized material when the monitored pattern matches the target pattern indicative of the desired condition of said one stage of the thin film being grown upon the substrate; and
    (e) repeating steps (a) through (d) during another growth stage of the build up of the thin film upon the substrate surface and so that the exposure of the substrate to the vaporized materials in the repeated step (d) is shut off or otherwise adjusted when the monitored pattern achieves a programmed and computer-stored target pattern indicative of the desired condition of said another growth stage of the thin film being grown upon the substrate.

13. In a process for growing or controlling the growth of a thin film of an alkaline earth oxide upon the surface of a semiconductor-based substrate involving the exposure of a surface of the semiconductor-based substrate to atoms of alkaline earth metal and oxygen in a high vacuum environment, the improvement comprising the steps of:

exposing the surface of the semiconductor-based substrate to atoms of the alkaline earth metal following the development of high vacuum conditions about the semiconductor-based substrate but before the surface of the semiconductor-based substrate is exposed to both alkaline earth metal atoms and oxygen atoms so that only atoms of the alkaline earth metal come to rest upon the surface of the substrate;

directing a beam in a computer-controlled process toward the surface of the substrate as the substrate is exposed to the atoms of the alkaline earth metal to effect diffraction from the substrate surface by the beam;

monitoring the diffraction pattern of the substrate surface as the atoms of the alkaline earth metal settle upon the substrate surface including the steps of providing a programmed and computer-stored target pattern of diffraction wherein the target pattern corresponds to the pattern of diffraction indicative of a preselected fraction of a monolayer of the alkaline earth metal being grown and wherein the monitoring step is sensitive to within 0.07 of a monolayer of the film and continually comparing the monitored pattern to the target pattern as the atoms of the alkaline earth metal settles upon the substrate surface;

automatically shutting off the exposure of the substrate to the atoms of alkaline earth metal when the monitored pattern matches the target pattern.

14. The improvement as defined in claim 13 wherein the preselected fraction of a monolayer in the step of shutting off is one-fourth of a monolayer of alkaline earth metal.

15. In a process for growing or controlling the growth of a thin film whose structure is designated as A'BO$_3$ upon one of an AO or a BO$_3$ truncated perovskite surface wherein each unit cell of the A'BO$_3$ structure is comprised of a single plane of alkaline earth oxide (AeO) and a single plane of a transition metal oxide (TmO) and wherein the growth process involves the exposure of an AO or a BO$_2$ truncated perovskite surface alternatively to atoms of the AeO plane and to atoms of the TmO plane during the build-up of the thin film one single plane layer-at-a-time in a high vacuum environment, the improvement comprising the steps of:

directing a beam in a computer-controlled process toward the AO or BO$_2$ truncated perovskite surface as the AO or BO$_2$ truncated surface is exposed to either the atoms of the Aeo plane or the atoms of the TmO plane to effect diffraction from the AO or BO$_2$ surface by the beam;

monitoring the diffraction pattern of the AO surface as the corresponding atoms settle upon the AO surface in a build-up process including the steps of providing a programmed and computer-stored target pattern of diffraction wherein the target pattern corresponds to the pattern of diffraction indicative of the desired condition of the film being grown and wherein the monitoring step is sensitive to within 0.07 of a monolayer and continually comparing the monitored pattern to the target pattern as the vaporized material settles upon the substrate surface; and automatically halting or adjusting the deposition process when the monitored pattern matches the target pattern.

16. The improvement as defined in claim 15 wherein the adjusting step includes a shutting off of the exposure of the AO or BO$_2$ truncated surface to atoms being deposited thereon when the monitored pattern achieves a condition indicative that a single plane layer of the AeO plane or the TmO plane has been deposited upon the AO or BO$_2$ truncated surface.

17. The improvement as defined in claim 14 wherein the directing step directs the beam toward the AO or BO$_2$ truncated surface in a <210> direction.

* * * * *